United States Patent
Kohlmann Von-Platen et al.

(10) Patent No.: US 7,719,077 B2
(45) Date of Patent: May 18, 2010

(54) METHOD FOR THE PRODUCTION OF A SEMICONDUCTOR COMPONENT

(75) Inventors: Klaus Kohlmann Von-Platen, Itzehoe (DE); Helmut Bernt, Berlin (DE); Detlef Friedrich, Itzehoe (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 727 days.

(21) Appl. No.: 10/541,819

(22) PCT Filed: Dec. 23, 2003

(86) PCT No.: PCT/DE03/04286
§ 371 (c)(1), (2), (4) Date: Feb. 10, 2006

(87) PCT Pub. No.: WO2004/064123
PCT Pub. Date: Jul. 29, 2004

(65) Prior Publication Data
US 2006/0172494 A1     Aug. 3, 2006

(30) Foreign Application Priority Data
Jan. 10, 2003   (DE) ................ 103 00 577

(51) Int. Cl.
*H01L 21/76* (2006.01)
(52) U.S. Cl. ..................... 257/500; 438/405
(58) Field of Classification Search ............. 257/500; 438/405, 404, 406
See application file for complete search history.

(56) References Cited

U.S. PATENT DOCUMENTS
4,860,081 A     8/1989   Cogan
(Continued)

FOREIGN PATENT DOCUMENTS
DE          4201910         6/1993
(Continued)

OTHER PUBLICATIONS
Yu Ohata et al., "Dielectrically Isolated Intelligent Power Switch", Proceedings of the Custom Integrated Circuits Conference, Portland, May 4-7, 1987, New York, IEEE, US, vol. CONF. 9, pp. 443-446.
(Continued)

*Primary Examiner*—Bradley K Smith
(74) *Attorney, Agent, or Firm*—Venable LLP; Robert Kinberg; Christopher Ma

(57) ABSTRACT

Disclosed is a method for the production of a semiconductor component provided with at least one first vertical power component (5,9) and at least one lateral, active component (6) and/or at least one second vertical power component (10) between which is placed at least one trench (2) filled with an insulation (4). Also disclosed is a semiconductor component produced with the method.

Figure 1:
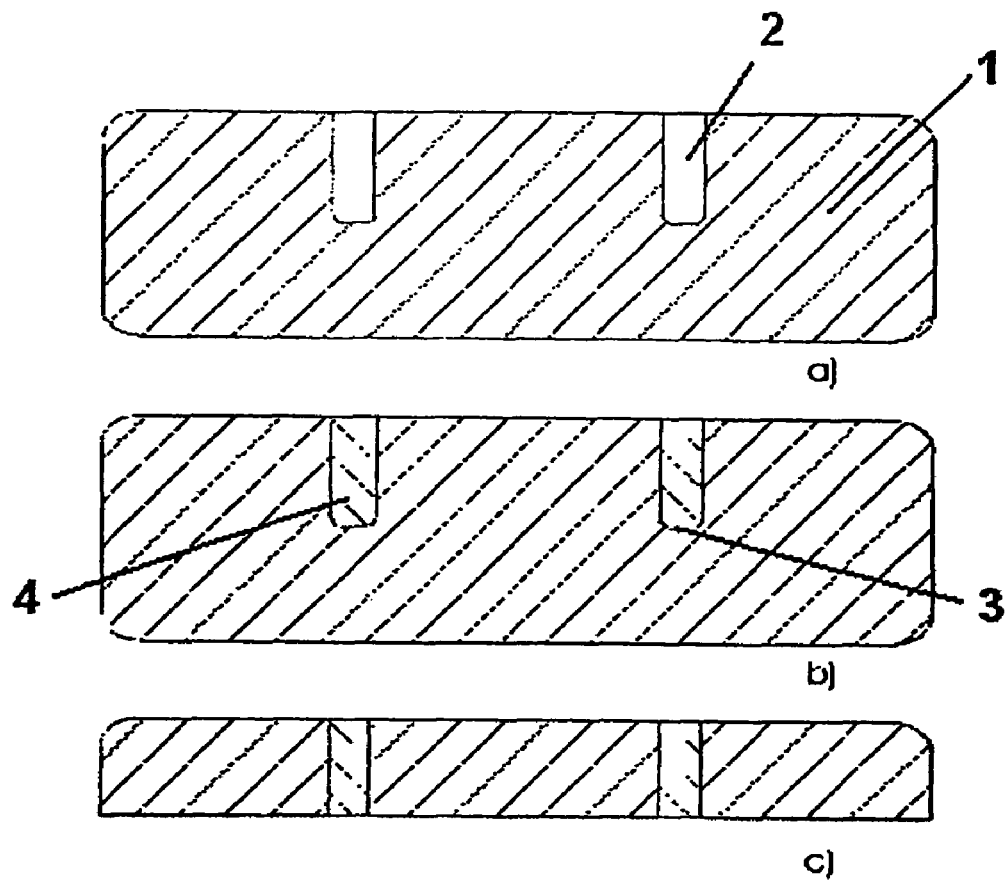

The semiconductor component is distinguished by an eccentric or concentric arrangement of the respective functional components (5,6,9,10) which are separated from each other by a trench insulation.

To produce such a semiconductor component, at least one trench (2), which completely encompasses at least one part area of the front side and then is filled with an insulation (4) is etched into a silicon substrate (1). In the further course of the method, the entire area of the silicon substrate (1) is thinned (1) from said back side to said insulation (4), i.e. to the bottom side of the insulation. Contacting of the power components (5,9,10) occurs from the back side.

11 Claims, 2 Drawing Sheets

U.S. PATENT DOCUMENTS

| | | | |
|---|---|---|---|
| 5,294,825 A * | 3/1994 | Nakagawa et al. | 257/487 |
| 5,356,827 A | 10/1994 | Ohoka | |
| 5,512,774 A | 4/1996 | Nakagawa et al. | |
| 5,909,626 A * | 6/1999 | Kobayashi | 438/406 |
| 5,981,983 A | 11/1999 | Funaki et al. | |
| 6,087,244 A | 7/2000 | Jeon | |
| 6,150,697 A | 11/2000 | Teshigahara et al. | |
| 6,229,179 B1 | 5/2001 | Song et al. | |
| 6,670,229 B2 * | 12/2003 | Vendrame et al. | 438/203 |
| 2002/0031897 A1 | 3/2002 | Ueda et al. | |

FOREIGN PATENT DOCUMENTS

| | | |
|---|---|---|
| EP | 0328331 A2 | 8/1989 |
| EP | 1267414 A2 | 12/2002 |

OTHER PUBLICATIONS

International Search Report dated Jul. 28, 2004, issued in counterpart application No. PCT/DE03/04286.

* cited by examiner a)

b)

METHOD FOR THE PRODUCTION OF A SEMICONDUCTOR COMPONENT

TECHNICAL BACKGROUND

The present invention relates to a method for the production of a semiconductor component comprising at least one first vertical power component and at least one lateral, active component and/or at least one second vertical power component as well as to a semiconductor component produced therewith.

PRIOR ART

Monolithic integration is a method of producing microchips in which the different components do not need to be adjusted and glued on individually, but rather the entire chip is produced in one piece. Apart from requiring less adjustment, such systems are unusually robust.

Power components, in particular bipolar stages and MOS stages for processing higher currents (I>1 amperes) with stray powers of $P_v>5$ watts, have been available for monolithic integration for some time. Today these components reach powers up to 1 kW, respectively currents up to 50 A.

Increasingly finding use in such concepts are drive circuits to activate the power stages and protective circuits to protect against thermal and electric overload. Finally even information processing has been included in the integration concept.

Such integrated circuits, which contain an information processing circuit component in addition to a power component on the chip are referred to as so-called smart power circuits.

Using these smart power circuits has both process-specific as well as component-specific advantages and disadvantages. Advantageous is in any case to have a bipolar process, a CMOS process and a PMOS process, in particular for MOS power stages with vertical current flow available on the chip. Such Bipolar, CMOS, PMOS and even BCD concepts are continuously being further developed.

Monolithic integration of the aforementioned power components is realized in various manners dependent on the voltage class. So-called smart power processes, such as BCD-MOS, are used for voltages up to some 100 V. Lateral separation of different sections occurs either by doping regions or by dielectric insulation.

In vertical power semiconductors, insulation of the power components from the control circuit is usually achieved by means of a pn-junction. The problem with such a pn-junction, however, is that between the source drain zones of the n-channel transistor and the source-drain zones of the p-channel transistor, there is a thyristor structure which can ignite and thus can impair the operation of the inverter, respectively destroy the component. This undesirable effect is referred to as the 'latch-up effect". The higher the desired degree of integration, the closer one tries to arrange the p-channel and n-channel structure, and the more effective this disturbing factor becomes.

For this reason, various processes based on a dielectric insulation of the different components of the circuit from each other have been developed. For example, instead of the pn-junction, the corresponding power component can also be insulated from the control circuit with the aid of dielectric insulation. The drawback of this type of insulation is that presently these approaches to monolithic integration of power components are still based on the extremely expensive silicon-on-insulator technology (SOI). In order to insulate the different components, trenches are etched to the buried oxide layer, and these trenches have to be filled with oxide or oxide and polysilicon.

A fundamental disadvantage of SOI technology is that an undesired control effect of the substrate is unavoidable. The substrate acts over the buried insulator like a second gate electrode on the transistors, the second gate electrode being integrated in a layer. If differences in potential occur between the substrate and the corresponding layer, this can lead to shifts in the threshold voltage and changes in the switching state of the transistors.

In this context, DE 42 01 910 A1 presents a further development. This printed publication describes a method for producing an integrated circuit having at least two vertical power components. The object of the method is to largely avoid switching procedures of a vertical power component influencing the control circuit, respectively a second vertical power component. The semiconductor element described in this printed publication is essentially distinguished by the control circuit lying above an etch recess on the rear side and being delimited from the etch recess by an etch stop layer. Moreover, the control circuit is insulated in lateral direction from the power components by a LOCOS insulation. A drawback of the power component described in this printed publication, however, is, firstly, that very much silicon surface is required for the lateral insulation regions and, secondly, that semiconductor components that are suited for this type insulation are not suited for higher voltage classes.

Based on the prior art, the object of the present invention is to provide a semiconductor component and a method for the production thereof that permit cost-effective integration of a vertical power component and a lateral, active component and/or additional vertical power components. In particular, with the aid of a component that solves the aforementioned object, it should be possible to integrate power components of higher voltage classes on the semiconductor component.

The object is solved with the method according to claim 1 and the semiconductor component according to claim 10. Advantageous further developments of the inventive concept are the subject matter of the subordinate claims and described in the following description with reference to the preferred embodiments.

According to the present invention, provided is a method for the production of a semiconductor component comprising a first vertical power component and at least one lateral, active component and/or at least one second vertical power component with the following steps:

provision of a silicon substrate having a front side and a back side, etching at least one trench which completely encompasses at least one part surface of the front side in the silicon substrate, filling up the at least one trench with an insulation which contains at least one dielectric or is a dielectric, conducting process steps on the front side of the silicon substrate in order to produce a first vertical power component and at least one lateral, active component and/or at least one second vertical power component in such a manner that both the first power component and the at least one lateral, active component and/or the one second vertical power component are arranged on the substrate concentrically or eccentrically around a common point of reference and are separated from each other by the at least one trench, thinning the entire surface of the silicon substrate from the back side to the insulation and contacting the power components from the back side.

The invented method permits integrating a multiplicity of vertical power components and lateral, active components on a semiconductor component. The electric insulation of the various components is achieved in that first trenches, which are filled with a dielectric, are etched into the silicon wafer. The depth of the trenches is set in such a manner that the depth corresponds to the thickness of the wafer after the thinning process. One or a multiplicity of trenches can be used to insulate the single components.

In a special embodiment of the invented method, the first power component, the at least one lateral, active component and/or the at least one second vertical power component are designed approximately ring-shaped and/or disk-shaped. Preferably, the lateral, active component is designed disk-shaped and is disposed on the front side in such a manner that it is completely encompassed by the trench in the first power component.

Realized in this manner is a concentric arrangement of the respective functional elements with the interior area of the semiconductor component containing lateral, active components and the power components being arranged toward the outside in rings around the lateral, active component.

In a further development of the invented method it is provided that after the thinning and before the contacting of the at least one power component, a dielectric is deposited on the back side of the substrate. The purpose of the dielectric is to completely electrically decouple the wafer substrate. In order to ensure backside contacting of the power components, in a subsequent process step the dielectric is opened at the corresponding sites for backside metalization.

On the front side of the silicon substrate preferably at least one trench which completely encompasses at least one part area of the front side is etched into the surface. The depth of the at least one trench is set in such a manner that it corresponds to the thickness of the wafer after the thinning process. For reasons of lateral field distribution, combinations of a dielectric and doped polysilicon can be used for filling up the trenches.

In another, particularly suited preferred embodiment of the invented method, a multiplicity of vertical power components and lateral, active components are arranged on a silicon substrate in such a manner that they are arranged concentrically or eccentrically around a common point of reference on the substrate and are insulated from one another by a trench produced by means of the aforementioned method.

Contacting the one power component or the multiplicity of power components preferably occurs using the following steps:
production of openings in the dielectric for contacting the at least one power component from the back side and application of a metalization on the back side.

In a special further development, the applied metalization is structured.

Another, especially suited preferred embodiment provides that the at least one lateral, active component is placed in a doped trough. In this manner it is ensured that the lateral, active components on the wafer surface are decoupled potentially from the live wafer back side. Preferably, for this purpose the at least one lateral, active component is placed in a p-doped trough.

Furthermore, particularly suited is to integrate the at least one lateral, active component in Bipolar, CMOS, NMOS and/or PMOS technology in the semiconductor component.

The invented semiconductor is provided with at least one first vertical power component and at least one lateral, active component and/or at least one second vertical power component, between which at least one trench filled with an insulation is placed. The described semiconductor component is distinguished by the insulation being provided with at least one dielectric and by the at least one vertical power component and the at least one lateral, active component being designed approximately ring-shaped and/or disk-shaped and arranged concentrically or eccentrically around a common reference point on the silicon substrate.

Due to the invented executions, the aforementioned semiconductor component permits integrating a multiplicity of vertical power components and lateral, active components on a component. Moreover, an essential advantage of the invented semiconductor is that vertical and lateral, active components are arranged in particularly space saving manner on a component.

Preferably, the invented semiconductor component utilizes power components for voltages of up to 1700 V. Depending on the used power component, the voltage classes vary between 600 and 1700 V. Therefore, it is possible to employ power MOS components in a voltage class of 100 to 200 V, IGBTs in a voltage class of up to 1700 V, preferably of 600 to 1200 V, or diodes as the power component.

In order to prevent high field strengths at the active region in case of blocking, the aforementioned power components need at any rate a edge bordering structure. Thus in components for voltages up to 1200 V, the length of these edge borderings is, for example, up to 600 µm. If the components were placed side by side in a conventional manner on a wafer and separated by a conventionally executed trench insulation, an edge bordering, over which the metalization would have to be led, would be provided for each single component. Contrary to this, the preferably concentric arrangement according to the present invention of the respective functional elements integrated on a semiconductor component greatly reduces the space required for the aforedescribed edge bordering structures. Moreover, this especially suited arrangement of the functional components considerably reduces the complexity of contacting.

In a special preferred embodiment, the power components are arranged in a ring from the inside to the outside. Preferably the at least one lateral, active component is completely encompassed by at least one filled trench and one vertical power component.

Moreover, to ensure that the lateral, active components on the wafer surface are also decoupled potentially from the live back side of the wafer, another special preferred embodiment provides that the at least one lateral, active component is placed in a doped trough.

Furthermore, it is especially advantageous to provide a dielectric on the back side of the semiconductor component in such a manner that a completely electric decoupling is ensured even after thinning the wafer substrate. For backside contacting of the power components, the dielectric is preferably provided with openings.

The invented method for producing a semiconductor component and the semiconductor is made more apparent in the following with reference to the figures described below without the intention of limiting the scope or spirit of the overall inventive idea.

BRIEF DESCRIPTION OF THE INVENTION

The present invention is described in the following using preferred embodiments with reference to the drawings by way of example without the intention of limiting the scope or spirit of the overall inventive idea.

Figure 2:
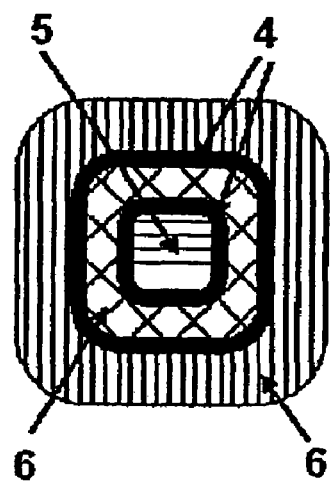
Figure 3:
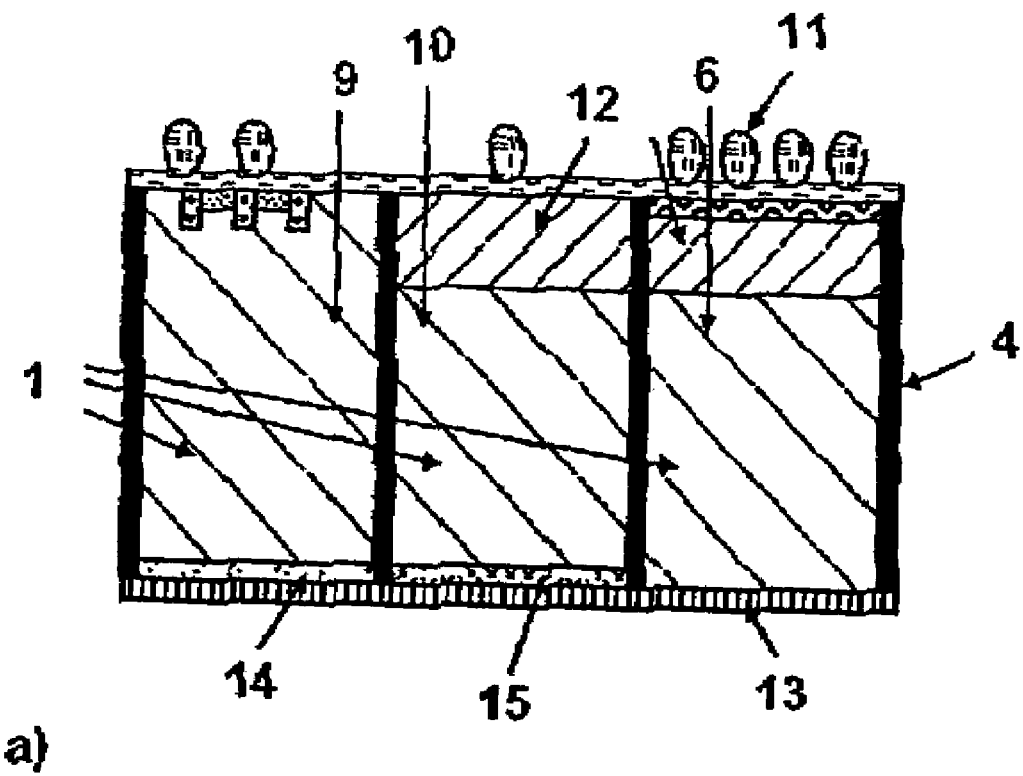
Figure 3:
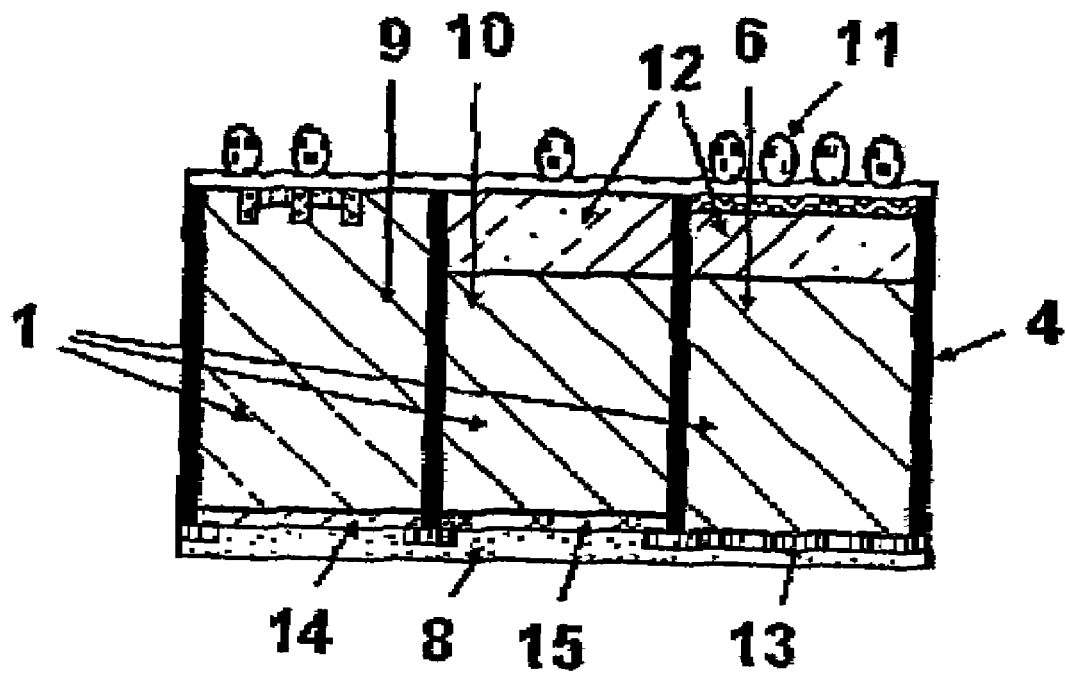

FIG. 1 shows process steps for electric insulation of the components on a wafer, FIG. 2 shows a concentric arrangement of the functional elements according to the present invention, and FIG. 3 shows the decoupling of the logic region in the present invention.

FIG. 1 depicts the process steps for electric insulation of the components on a wafer. The electric insulation of the different components is achieved by first etching trenches 2 into the silicon substrate 1. Then in a second process step, the trenches 2 are filled with a dielectric or a combination of a dielectric and polysilicon as the insulation layer 4. After this, the silicon substrate 1 is thinned on the back side to the bottom 3 of the trench 2 etched into the silicon substrate 1. In this manner, the insulation layer 4 filled into the trenches 2 is exposed on the back side. The depth of the trenches 2 is set in such a manner that it corresponds to the thickness of the wafer after the thinning process.

In contrast, FIG. 2 depicts a semiconductor component executed according to the present invention. The respective functional elements 5,6 are arranged concentrically and separated by trench insulations 4 on a substrate. Alternatively, the functional elements 5,6 are arranged eccentrically. The interior area of the chip contains the lateral, active components 6 such as for example components executed using Bipolar, CMOS, NMOS or PMOS technology. The power components 5 such as for example IGBTs and/or diodes are placed in a ring around the lateral, active component 6. Of course, both the power components 5 and/or a lateral, active component 6 can be arranged in such rings about a centrally placed and disc-shaped functional element.

FIG. 3 depicts a sectional view of an invented semiconductor component. Arranged on the semiconductor component are an IGBT 9, a diode 10 and a lateral, active component 6, which are separated from each other in an electrically insulating manner by a trench insulation 4. Provided on the front side is a multiplicity of front side contacts 11 in the form of soldering bumps. Furthermore, the lateral, active component 6 is embedded in a doped trough 12, which is executed as deep p-doping. In this manner, the lateral, active component 6, which is located on the wafer surface, is potentially decoupled from the live back side of the wafer.

Fields occurring are received via the space charge region of the doped trough 12. For complete electrical decoupling, a dielctric 13 is placed on the back side after thinning the wafer substrate. As FIG. 3b shows for backside contacting the power components 6, the dielectric 13 is opened at the corresponding sites for backside metallization 8 which is applied on the back side of the semiconductor as the final step.

LIST OF REFERENCE

1 Silicon substrate
2 Trenches
3 Bottom of the trench
4 Insulation layer
5 Power component
6 Lateral, active component
7 Edge bordering structure
8 Metalization
9 IGBT
10 Diode
11 Front side contact
12 Doping trough
13 Dielectric
14 P+ implant
15 n+ implant

What is claimed is:

1. A semiconductor component comprising:
    at least one first vertical power component extending from a front side to a back side of a silicon substrate; and
    at least one lateral, active component between which at least one trench filled with an insulation is placed, said at least one trench extending from said front side to said back side of said silicon substrate,
    wherein said insulation comprises at least partly one dielectric,
    wherein said at least one vertical power component and said at least one lateral, active component are designed approximately ring-shaped and/or disk-shaped and are arranged eccentrically or concentrically around a common point of reference on said silicon substrate, and
    wherein said at least one trench extends substantially along an entire depth of said at least one first vertical power component.

2. A semiconductor component according to claim 1, wherein said at least one power component is an IGBT, a PMOS and/or a diode.

3. A semiconductor component according to claim 1, wherein said at least one power component is suited for voltages of up to 1700 V.

4. A semiconductor component according to claim 1, wherein said insulation is composed of a combination of insulating, semiconducting and/or conducting materials.

5. A semiconductor component according to claim 1, wherein said insulation is composed of a combination of a dielectric and polysilicon.

6. A semiconductor component according to claim 1, wherein said first vertical power component and/or said at least one lateral, active component is completely encompassed by at least one filled trench and/or said at least one second vertical power component.

7. A semiconductor component according to claim 1, wherein said at least one lateral, active component is placed in a doped trough.

8. A semiconductor component according to claim 1, wherein a dielectric is applied on said back side of said substrate.

9. A semiconductor component according to claim 8, wherein said dielectric is provided with openings though which said power components are contactable.

10. A semiconductor component according to claim 1 comprising:
    at least one second vertical power component extending from said front side to said back side of said silicon substrate, separated from said first vertical power component by a second trench filled with an insulation, said second trench extending from said front side to said back side of said silicon substrate,
    wherein said insulation comprises at least partly one dielectric and
    wherein said at least one second vertical power component is designed approximately ring-shaped and/or disk-shaped and is arranged eccentrically or concentrically around said common point of reference on said silicon substrate.

11. A semiconductor component comprising:
    at least one first vertical power component extending from a front side to a back side of a silicon substrate;
    at least one lateral, active component between which at least one trench filled with an insulation is placed, said at least one trench extending from said front side to said back side of said silicon substrate, wherein said at least one vertical power component and said at least one lateral, active component are designed approximately ring-shaped and/or disk-shaped and are arranged eccentrically or concentrically around a common point of reference on said silicon substrate; and at least one second vertical power component extending from said front side to said back side of said silicon substrate, separated from said first vertical power component by a second trench filled with an insulation, said second trench extending from said front side to said back side of said silicon substrate, wherein said insulation comprises at least partly one dielectric, and wherein said at least one second vertical power component is designed approximately ring-shaped and/or disk-shaped and is arranged eccentrically or concentrically around said common point of reference on said silicon substrate.

* * * * *